US007215716B1

(12) United States Patent
Smith

(10) Patent No.: US 7,215,716 B1
(45) Date of Patent: May 8, 2007

(54) NON-LINEAR ADAPTIVE AM/AM AND AM/PM PRE-DISTORTION COMPENSATION WITH TIME AND TEMPERATURE COMPENSATION FOR LOW POWER APPLICATIONS

(75) Inventor: Francis James Smith, Farmington, UT (US)

(73) Assignee: Francis J. Smith, Farmington, UT (US)

( * ) Notice: Subject to any disclaimer, the term of this patent is extended or adjusted under 35 U.S.C. 154(b) by 743 days.

(21) Appl. No.: 10/603,798

(22) Filed: Jun. 24, 2003

Related U.S. Application Data

(60) Provisional application No. 60/391,464, filed on Jun. 25, 2002.

(51) Int. Cl.
H04K 1/02 (2006.01)
(52) U.S. Cl. .................. 375/296; 375/284; 375/285
(58) Field of Classification Search ............... 375/296, 375/284, 285
See application file for complete search history.

(56) References Cited

U.S. PATENT DOCUMENTS 6,785,342 B1 * 8/2004 Isaksen et al. ............ 375/284
6,909,756 B1 * 6/2005 Nakajima .................. 375/296
6,985,704 B2 * 1/2006 Yang et al. ................ 455/126
2002/0034260 A1 * 3/2002 Kim ......................... 375/296
2002/0136324 A1 * 9/2002 Nagasaka .................. 375/296
2003/0058959 A1 * 3/2003 Rafie et al. ................ 375/296
2003/0179830 A1 * 9/2003 Eidson et al. ............. 375/296

* cited by examiner

Primary Examiner—Kevin Kim

(57) ABSTRACT

This invention provides a technique and an architecture to pre-distort signals such that when the signals are amplified, the non-linear distortions of the amplifier chain are opposite that of the pre-distortion thus yielding a distortion free or nearly distortion free signal at the output of the amplifier chain. This invention provides for a low power application by using a LUT predistortion that is performed on a composite real signal (I and Q combined) such that the size of the LUTs required is reduced to a very small size. In this invention, the I and Q input signals are digitally modulation with quadrature digital sinusoidal signals and then combined to create the real composite signal at a digital IF. The real signal is then pre-distorted to compensate for AM/AM distortion first and then for AM/PM distortion. The pre-distorted signal is then digitally decomposed back in to I and Q samples for conversion to analog and up conversion to RF. The non-pre-distorted real signal is sampled and compared with a sample of the post amplified signal and the non-linear update algorithm is updated to compensate for the variation of non-linear distortion as a function of time and temperature. The architecture and techniques described herein provide for a low power and low memory implementation that can be used in mobile applications such as cell phones and Personal Data Devices (PDAs).

40 Claims, 5 Drawing Sheets

Figure 1: AM/AM and AM/PM Non-linear Distortion of an Amplifier

Figure 3 Sub-sample phase shifting

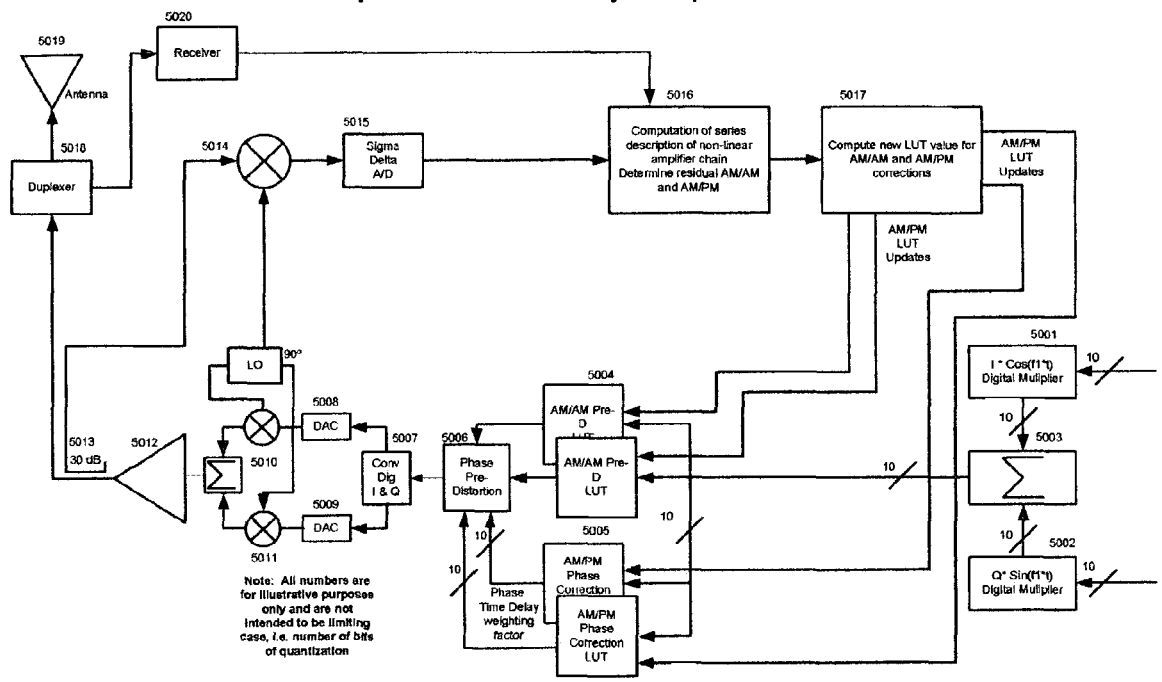
Figure 5 Mathematical Series Description of NL for Pre-distortion

NON-LINEAR ADAPTIVE AM/AM AND AM/PM PRE-DISTORTION COMPENSATION WITH TIME AND TEMPERATURE COMPENSATION FOR LOW POWER APPLICATIONS

PRIORITY

The present patent application claims priority to the corresponding provisional patent application 60/391,464 Non-Linear Adaptive AM/AM and AM/PM Pre-Distortion Compensation with Time and Temperature Compensation, dated Jun. 25, 2002.

FIELD OF THE INVENTION

The field of the invention relates to nonlinear amplifiers in radio transmitters for wired and wireless applications as well as audio amplifiers for applications such as high power audio systems for amplification of music and entertainment type applications. This invention is also applicable to any amplifier wherein nonlinear distortion is experienced in applications such as radio frequency communications, audio entertainment systems and public address systems. More specifically, it relates to non-linear compensation of the distortions caused by non-linear amplifiers. This invention provides pre-compensation of the AM/AM and AM/PM non-linear distortion characteristics of the amplifier chain and compensation for changes in the AM/AM and AM/PM characteristics over time and temperature with low power consumption.

BACKGROUND OF THE INVENTION

Definition of Terms:

1.) AM/AM: Amplitude to Amplitude Modulation

2.) AM/PM: Amplitude to Phase Modulation

3.) NL: Non-linear

4.) Pre-Distortion: Applying the opposite distortion (to what the signal of interest will be subject to) to a signal of interest so the when the signal of interest is distorted by the channel the end result is that the pre-distortion is cancelled by the channel distortion to deliver a nearly non-distorted signal 5.) SOI: Signal of Interest or the desired signal 6.) QAM: Quadrature Amplitude Modulation 7.) 16QAM: A modulated signal that has 16 different amplitude-phase states.

8.) Higher order Modulation: Typically signal with more than 4 phase states and one amplitude state, such as QPSK or 4PSK. Higher order modulations include but are not limited to 8PSK, 16 QAM, 64 QAM, 256QAM etc.

9.) Non-constant Envelope Signals: Signals with varying amplitude as a function of time.

10.) Audio frequencies: Frequencies of sound that are discernable by the human ear 11.) SSPA: Solid State Power Amplifier 12.) TWTA: Traveling Wave Tube Amplifier 13.) PAE: Power Added Efficiency: Ratio of the power applied to an amplifier and the power output of the amplifier: Ratio is always less than 1.0

14.) RF: Radio Frequency

15.) IF Intermediate Frequency

16.) LUT: Look Up Table

DESCRIPTION OF FIGURES

FIG. 5: Top Level Block Diagram of Non-Linear Transmitter with Series Description of Non-linearity Compensation Computation.

BACKGROUND

All amplifiers are nonlinear devices and have a nominally linear and a nonlinear range. To avoid signal distortion, amplifiers often have to be used in their linear range wherein the energy conversion ratio, or power added efficiency (PAE) is smaller than in the nonlinear range. In the nonlinear range, the signals will be subject to amplitude to amplitude and amplitude to phase modulation. This is caused by the fact that as the amplifier is operated in the nonlinear region, and the ratio of input to output power is not constant. As the input signal amplitude increases, a disproportionate increased in the output power will be manifested. This is called amplitude modulation to amplitude modulation (AM/AM) since an unwanted additional amplitude modulation is experienced. This will be experienced up to the maximum output power at which point all input values will have the same output value. This is called compression and will result in the signal being clipped. This will result in the signal having square or sharper edges in the time domain which means that higher frequency components will be generated and side lobe re-growth in the frequency domain will be experience. This can and often does cause out of band emissions in addition to distorting the amplified signal.

In addition to the amplitude distortion discussed above, the output phase of the signal is not constant at different levels of the amplitudes of the input signal to be amplified. The amplified signal experiences a phase modulation as a function of the input amplitude and this relationship is not constant, it is non-linear. This is called AM/PM conversion or distortion.

The AM/AM and AM/PM distortions are theoretically not a problem with constant envelop signals such as QPSK, 8PSK and 16PSK. However, when these signals are band limited, such as is often done with a root raised cosine type of filter, the signals experience induced controlled intersymbol interference (ISI) and amplitude between decision points can exceed the nominal amplitude by 3 to 6 dB depending on the band width reduction (the value of alpha). Alpha is the % bandwidth expansion of a perfect Nyquist filter. The smaller the alpha, the more narrow the signal bandwidth and the greater the induced ISI and the greater the peak to average power level. When this happens, the signal is no longer a constant envelop signal and it will be subject to the distortions discussed herein.

Figure 1:
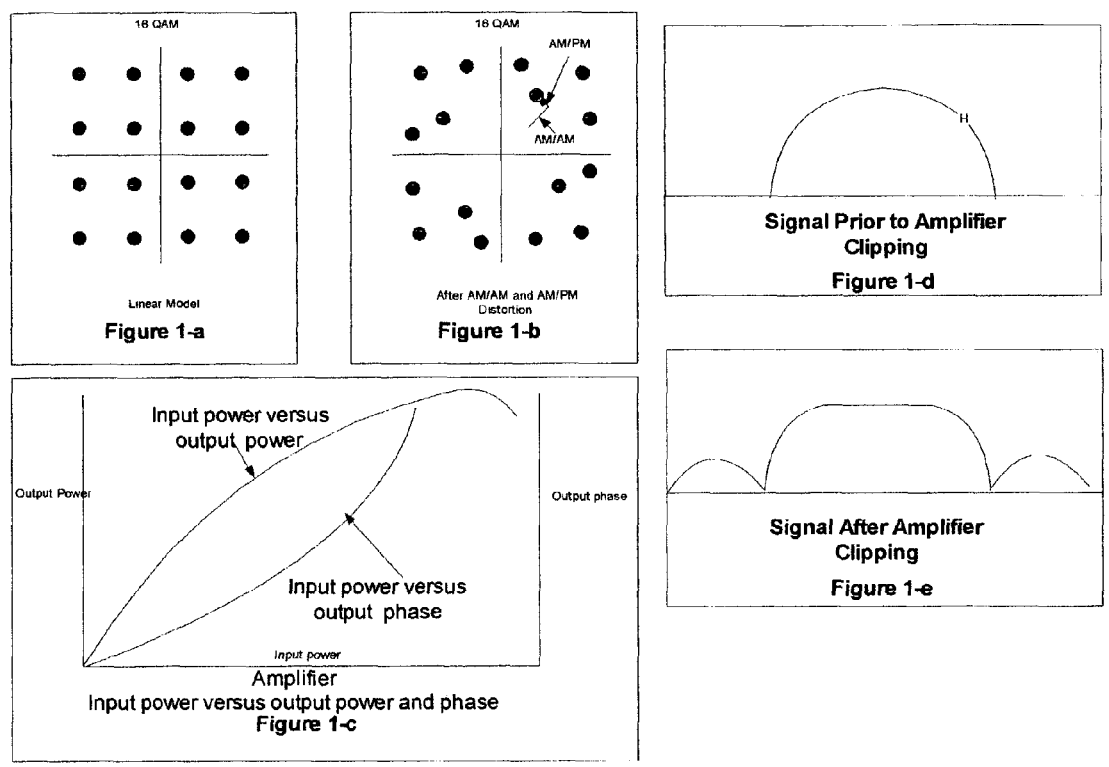
FIG. 1: Depiction of distortion caused by the AM/AM and AM/PM characteristics of a non-linear device.

The distortions that are created by the Amplitude to Amplitude (AM/AM) and the Amplitude to Phase (AM/PM) are shown in FIG. 1. In FIG. 1a, a 16QAM signal constellation is shown. In FIG. 1b, the result of the AM/AM and AM/PM distortion is shown. In this invention, the opposite AM/AM and AM/PM will be introduced to the signal such that at the output of the nonlinear elements, the 16QAM signal will look like FIG. 1a. An example of the mechanism that causes the AM/AM and AM/PM distortion is shown in FIG. 1c. The top curve shows the relationship between the input power on the horizontal axis and the output power on the vertical axis. The lower curve shows the relationship between the input power level and the output phase. As can be seen, there is a nominally linear region and a non-linear region. For typical solid state amplifiers and traveling wave tube amplifiers, the input power back off can be as great as 20 dB to support a 16 QAM type of modulation. Signals with even greater peak to average power can experience greater back off requirements.

When high order modulations are used, such as 16 QAM or 64 QAM or others up to 1024 QAM and higher, the AM/AM and AM/PM distortions will have an enormous impact on the system performance if the amplifiers are not backed off many dB. This can easily be as much as 15 or 20 dB for SSPAs and TWTAs. This effect is also seen in audio amplifiers which experience distortion when sound systems are operated at high amplification. This invention is also applicable to sound systems for mitigation of the distortion characteristics experienced in stereos and other audio systems.

Pre-compensating for the nonlinear characteristics of amplifiers allows the amplifiers to be operated in their nonlinear range wherein the power efficiency is greatest. The power efficiency or the Power Added Efficiency (PAE) is the ratio of the power required to power the amplifier to the power output from the amplifier. This ratio is typically 15 to 30% for linear amplifiers and can be as high as 50 to 60% for nonlinear amplifiers. If an amplifier has an output power of 1 watt and the PAE is 33%, the amplifier will dissipate 3 watts. If the PAE is 50%, it will dissipate 2 watts. This will translate to a 33% reduction is dissipated power. This has three key benefits. One is that the total output power can be increased. Second is that smaller amplifiers can be used and third is that the yield on amplifiers will be higher because the linearity requirements can be significantly relaxed.

The nonlinear pre-distortion compensates for the AM/AM and AM/PM by inducing the opposite AM/AM and AM/PM on the signal to be amplified is such a manner that when the nonlinear characteristics of the amplifier (or amplifier chain) are experienced, by the signal, the induced AM/AM to AM/PM are nearly perfectly cancelled out. These AM/AM and AM/PM characteristics can not be guaranteed to remain constant over time and temperature. It is however reasonable to assume that they would not change any faster than the temperature. If the temperature is controlled, the variation of the distortion characteristics will vary slowly, but in an environment where the temperature can change quickly, such as in a hand held device, the changes can occur much more rapidly. To accommodate this situation, this invention contains a feed back loop where in the amplified signal is sampled and fed back to the non-linear compensation function wherein the amplified signal is compared to the non-pre-distorted, pre-amplified signal and the AM/AM and AM/PM pre-distortion characteristics are updated. This is done is a near real time loop, not a real time loop, so stability of the loop is not a problem. In another embodiment of this invention, the sample of the amplified signal is used to compute a non-linear mathematical description of the amplifier chain. This is done by computing a series like a Voltera or Taylor series (or any series that describes a non-linear channel) based on the sampled values of the amplified signal. With the non-linear description of the channel, the residual AM/AM and AM/PM can be computed and the pre-distortion function will be updated. In different embodiments of this invention, the copy of the transmitter (amplified signal) is received from the receiver, and in one case, it is received from a self contained loop within the transmitter. The residual AM/AM and AM/PM is the error in the pre-distortion and this error is used to update the pre-distortion algorithm values.

SUMMARY OF INVENTION

This invention provides a technique and an architecture to pre-distort signals such that when the signals are amplified, the non-linear distortions of the amplifier chain are opposite that of the pre-distortion thus yielding a distortion free or nearly distortion free signal at the output of the amplifier chain. This invention provides for a low power application by using a LUT predistortion that is performed on a composite real signal (I and Q combined) such that the size of the LUTs required is reduced to a very small size. In this invention, the I and Q input signals are digitally modulation with quadrature digital sinusoidal signals and then combined to create the real composite signal at a digital IF. The real signal is then pre-distorted to compensate for AM/AM distortion first and then for AM/PM distortion. The pre-distorted signal is then digitally decomposed back in to I and Q samples for conversion to analog and up conversion to RF. The non-pre-distorted real signal is sampled and compared with a sample of the post amplified signal and the non-linear update algorithm is updated to compensate for the variation of non-linear distortion as a function of time and temperature. The architecture and techniques described herein provide for a low power and low memory implementation that can be used in mobile applications such as cell phones and Personal Data Devices (PDAs)

DETAILED INVENTION DESCRIPTION

Figure 2:
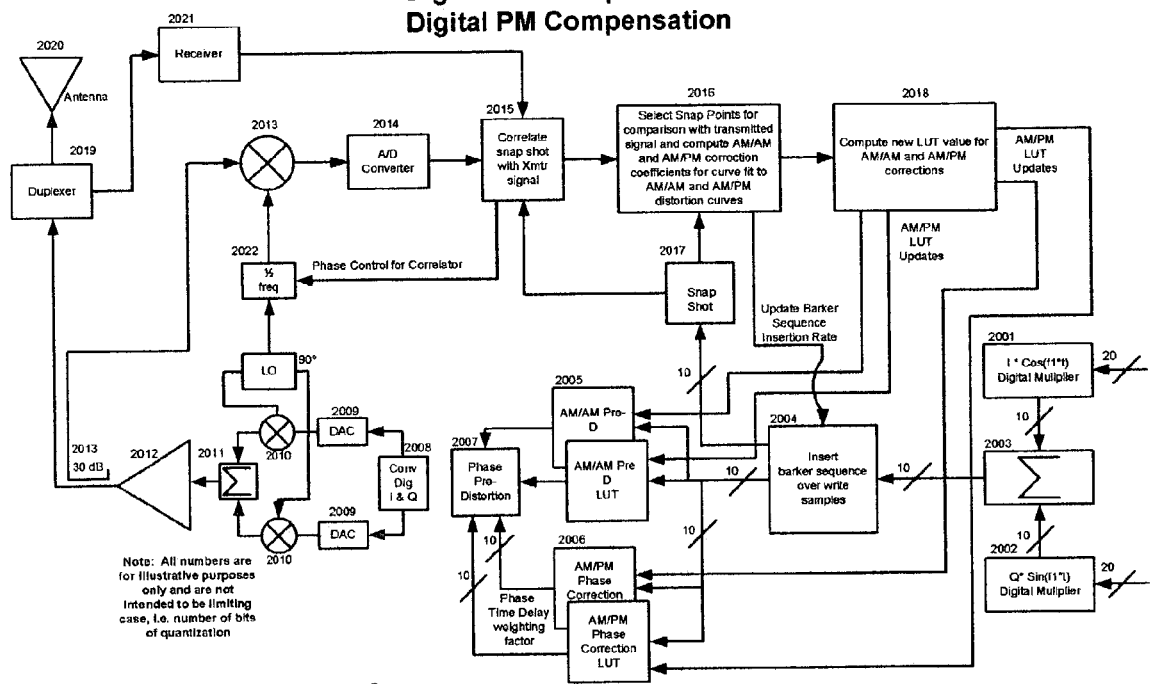
FIG. 2: Top Level Block Diagram of a Non-linear Transmitter with Digital AM/AM and AM/PM Pre-distortion Compensation

The top level block diagram of one embodiment of the NL Transmitter is shown in FIG. 2. In one embodiment, the phase correction is done digitally and in another it is done by an analog method of a digitally controlled phase modulation of the LO. The number of bits of quantization that are shown in FIG. 2 are for illustrative purposes and are not intended to limit the scope of this invention. Control lines and clock lines are shown in red while signal lines are shown in black. As one versed in the art will recognize, the number of bits of processing does not detract from the general application of the invention.

In FIG. 2 blocks 2001 and 2002, the digital I and Q bits streams are received from a baseband processor. In one embodiment of this invention, the inputs are 10 bits words at nominally 10 MHz, and in other embodiments, the word rates and number of bits will vary depending on the application. This invention is applicable to many standards and telecommunications applications to include wired and wireless. The nonlinear compensation of the amplifiers discussed herein is applicable to audio systems. In these audio embodiments, the digital input may be generated by an A/D converter placed between the audio analog source and the blocks 2001 and 2002. In the event that the signal to be amplified is a composite real signal and not decomposed into orthogonal I and Q signals, the I or the Q block 2001 or 2002 is used and block 2003 is bypassed.

The pre-distortion of the phase and amplitude of the signal to pre-compensate for the AM/AM and AM/PM is dependent on the amplitude of the real signal. In one embodiment of this invention, the complex I and Q signals are converted to a compound real signal at a low digital IF and the amplitude of this signal, sample by sample, is used to determine the phase and amplitude pre-distortion to be applied to this signal.

In one embodiment of this invention, the digital I and Q inputs are converted to a digital compound real signal at a low digital IF. This is done by multiplying the I and Q digital input words by the digital sine and cosine of a low IF, on the order of 2 to 3 times the baseband bandwidth of the information signal. The selected IF is a design option and is not intended to limit the scope of this invention. As one versed in the art will recognize, the selection of the IF does not detract from the general application of the invention. The selection of the IF is limited by the digital sampling rate. In block 2001, the I channel is multiplied by the cosine(f*t) and in the Q channel is multiplied by the sine(f*t). ("f" is the frequency and "t" is time) The outputs of blocks 2001 and 2002 are added together in block 2003 to create the compound real signal.

In block 2004, in one embodiment of this invention, samples at some low percentage interval are "stolen" for use in the correlation function 2015. Stolen means that the samples are over written. This makes the samples incorrect for the signal being amplified (SOI), but it is done at such a low rate as to have a small impact on the signal to noise ratio and the bit error rate. After the correlation process has determined the time offsets, the over writing is reduced to low number of samples or zero. This is covered later as part of the update process where in the non-pre-distorted samples are compared to the post amplified samples to determine the error in the pre-distortion parameters and to update the parameters to adjust the pre-distortion to adjust to changes in the non-linear distortions of the analog components as a function of time and temperature. In one embodiment of this invention, the samples to be over written are over written with a binary sequence like a Barker Sequence with high autocorrelation properties. In another embodiment, the Barker sequence is appended with 2 to 4 bits to allow for determination of the phase offset of the signal to assist in the cross correlation process in block 2015.

In one embodiment, the rate at which the over writing takes place is variable. When the process in originated, the over writing is done at a higher rate. When a time correlation between the pre-amplified signal and the post amplified signal has been determined, the over writing rate is significantly reduced or eliminated. The initial rate and the variable rates are subject to each application, but when the correlation has been established, in one embodiment, the insertion of correlation signals (Barker sequences or the like) can be reduced to rates that will induce BER rates on the order of E-6 or E-7. ($10^{-6}$ or $10^{-7}$) or possibly zero. Once the time offset for the system has been established, the sample over writing required is very small or reduced to zero. In one embodiment of the invention, the amplitude levels selected for the binary values of the Barker Sequence are selected such that they are in the linear range of the amplifier and thus are not pre-distorted and will be easier to cross correlate in block 2015.

In one embodiment of the invention, when the time correlation between the pre-amplified and the post amplified signals has been established in block 2015, the over writing function 2004 may be dropped to a very low level and the over writing function used to insert values as necessary to calibrate the pre-distortion algorithm.

In one embodiment of this invention, after the time correlation between the pre-amplified signal and the post amplified signal has been established, the block 2015, the correlation is done solely based on the sample streams with little or no over writing. As will be discussed below, when the correlation between the pre-distorted signals and the post amplified signals has been established, the sample to sample values can be compared to determine whether an update to the AM/AM and AM/PM pre-distortion corrects is warranted.

In a near ideal situation, the post amplified and the non-pre-distorted samples should be identical when adjusted for gain and timing offset. That is to say that the post amplified signals should show no distortion relative to the non pre-distorted values that are output from block 2004 or actually 2017 where a snap shot of the non-pre-distorted samples are captured. As will be discussed below, in one embodiment of this invention, any distortion that does show up (as a result of the comparison of the post amplified and the non pre-distorted signals) will be used to update the pre-distortion parameters in blocks 2005 and 2006. This is done in block 2018 and new LUT values are loaded into the second memory LUTs shown for 2005 and 2006 while the other one is being used to pre-distort the samples. When the LUT download is done, the second memory LUT is switched in. This prevents any disruption in the pre-distortion process and provides for the updates to the pre-distortion to be done in near real time versus real time.

In one embodiment of the invention, the AM/AM and the AM/PM corrections are made sequentially as shown in FIG. 2. In another embodiment, the corrections are made simultaneously by a LUT table that replaces 2001 and in which the I and Q vectors (samples) are pre-distorted together.

As shown in FIG. 1-*d*, the spectrum of a non-compressed signal does not have out of band emissions. As shown in FIG. 1-*e*, when the signal is compressed as a function of the partial or complete saturation of the amplifier, the peaks of the signal in the time domain are "clipped" and this makes the signals more "square" with sharp corners. This generates high frequency components as shown in FIG. 1-*e*. These higher frequency components manifest themselves as side lobes which cause out of band emissions. In one embodiment block 2005 (which contains two memory LUTs which are switched in and out to support updates) there is a LUT that performs two functions in one step. The AM/AM pre-distortion is performed by addressing the memory locations with the non-pre-distorted values and outputting the pre-distorted values. To preclude any clipping of the SOI in the amplifier chain, the pre-distorted values in the LUT are computed in block 2018 and exclude any values that would result in clipping of the amplifier. This effectively pre-clips the signal so that the amplifier will not clip the signal. The output of block 2005 has been compensated for the amplitude compression that the amplifier chain will induce. Since the I and Q vectors (samples) have been combined digitally in block 2003, perfect I-Q quadrature is preserved as long as the samples are received correctly from the baseband processor.

In one embodiment of this invention, block 2006 (which contains two memory LUTs which are switched in and out to support updates) performs the function of determining the phase correction required. The input to block 2007 from block 2006 is the phase correction required to compensate for the AM/PM at the amplitude of the sample. There two programmable LUTs in block A006. While one is being loaded with updated corrections, the other is being used to determine the required phase correction for the sample.

In one embodiment of the invention, block 2007 performs the phase correction to the samples as required to pre-compensation for the AM/PM distortion. If sub-sample phase shifts are required, the phase will be corrected as shown in the next paragraph.

Figure 3:
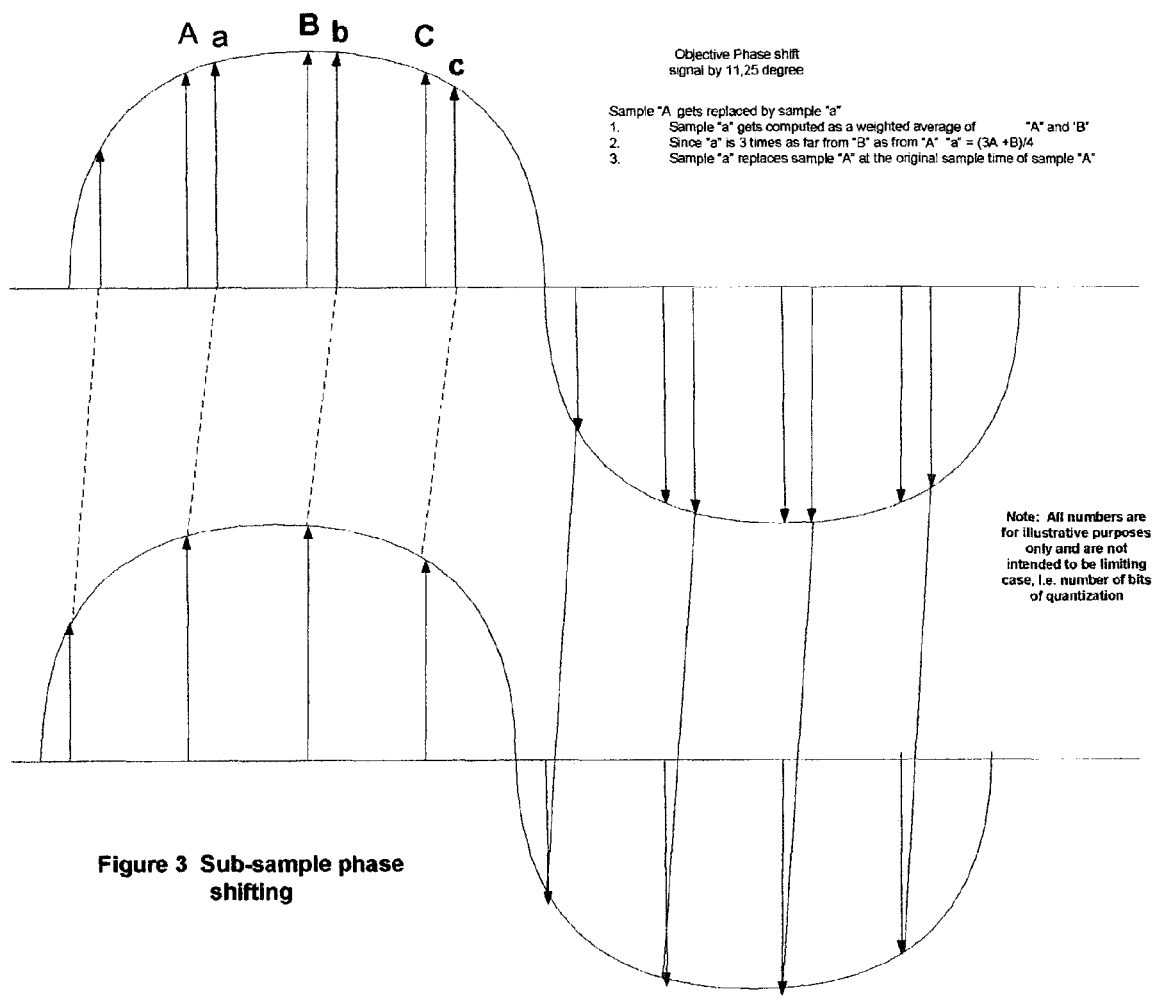
FIG. 3: Depiction of the technique for sub-sample phase sifting of a digitally sampled signal

FIG. 3 shows how, in one embodiment of the invention, the phase can be adjusted by any desired increment, even when the sample rate is low. In this embodiment, the original samples A, B, and C, are converted to samples a, b, c by weighted interpolation. The new samples a, b, and c are mapped into the time slots of A, B, C. By properly selecting the weighting of values A, B, and C in the interpolation process, any arbitrary phase shift can be achieved.

In one embodiment of this invention, the output of 2007 is a digital sample at the required sample rate (application dependent) with the require phase corrections to each sample to compensate for the AM/PM distortions. The output of 2007 in input to 2008 where the pre-distorted digital compound real signal is decomposed back into I and Q values. This is done by taking blocks of 4 samples and averaging the first and the third to get one channel and the second and the fourth to get the other channel. These pre-distorted I and Q signals are now input to the digital to analog converters 2009.

In one embodiment of this invention, the analog signal outputs from the 2009 ADCs are up converted in frequency to the desired RF frequency in quadrature by mixing the signal with the output of the LO signals that are 90 degrees offset from one another. These signals are then combined in block 2011 to create the compound real signal at RF for amplification in the High Power Amplifier (HPA) 2012.

In one embodiment of this invention, a high power amplifier (HPA) 2012 is used to amplify the signal for transmission over the airwaves or over a wired system or an audio system. A pre-amplifier is often used prior to the HPA, but is not shown in the block diagram. The example in FIG. 2 is for the airwaves transmission. In another embodiment of this invention, transmission would be over a wired system. In one embodiment, the HPA is an audio amplified.

In one embodiment of this invention, a coupler is used to sample the post amplified signal, 2013. At the output of the HPA, the signal has a high signal to noise ratio and a 30 dB coupler will yield a good quality sample of the signal without degrading the transmit power 30 dB is an example and the final implementation value may vary. As one versed in the arts will recognize, the value of the couple does not detract from the general application of the invention. The sample signal from the coupler is sent to the down converter mixer 2013. This signal is then sampled by an A/D converter (block 2104) and digitally down converted to baseband for correlation with samples of the non pre-distorted signals in block 2015. In one embodiment of this invention, a conventional flash A/D converter is used and in another a sigma Delta A/D converter is used.

In one embodiment of this invention, the mixer 2013 is used to convert the sampled signal to a low IF. In another embodiment of this invention, block 2013 is used to convert the signal to baseband or zero IF. The sampled values in 2014 are then digitally down converted to baseband or zero IF as required and input to the correlation block 2015.

In another embodiment, the A/D conversion of the sampled post amplified signal (flash or sigma delta) is done at the amplified RF frequency without analog down conversion. Down conversion is done digitally in this case as part of the decimating filtering in clock 2014.

In one embodiment of this invention, block 2017 receives a copy of the output of block 2004. Block 2017 takes a snap shot function where in a window of samples of the non pre-distorted samples is taken for processing in blocks 2015 and 2016. The size of this snap shot will be a function of the size of the required correlation window. As one versed in the arts will recognize, the size of the snap shot is an implementation detail and does not detract from the general application of the invention.

In one embodiment of this invention, the snap shot output of the block 2017 is input to block 2015 along with the output of the A/D conversion function in 2014. Block 2015 performs a cross correlation function between the non-pre-distorted samples (from block 2017) and those that have been amplified through the nonlinear elements. Block 2015 sends a digital phase adjust signal to block 2022 as required to adjust the phase of the LO which will adjust the phase of the sampled values of the post amplified signals to align the samples in the cross correlation process. In one embodiment of this invention, the phase adjustment is done digitally in block 2015. The phase (time) adjusted samples of the post amplification process are input to the block 2016.

In one embodiment of this invention, the sample of the amplified transmit signal is received from the receiver 2021. This transmitter signal will have some feed through to the receiver in the duplexer 2019. In one embodiment, the feed through signal is sampled in the receiver and provides the sample of the post amplified signal to the correlation function 2015. In this case, the phase adjustment is done digitally to align the post amplified and non pre-distorted signals for the correlation function. The phase (time) adjusted samples of the post amplification process are input to the block 2016.

In one embodiment of this invention, when block 2016 has determined that the correlation function is providing adequate time correlation between the post amplified samples and the non-pre-distorted samples, block 2016 will send a command to block 2004 to decrease the rate at which the over writing of the samples with Barker Sequences are being inserted to a lower or possibly zero rate. If greater control on the correlation is required, the rate will be increased.

In one embodiment of this invention, after the correlation time delay offset has been determined, the correlation is done with no over writing and the correlation is updated by correlation of just the sampled value from 2014 and 2017.

In one embodiment of this invention, block 2016 takes the correlated and aligned non-pre-distorted samples from block 2017 and the samples of the post amplified signal and compares these samples to those from 2015. If the pre-distortion process was perfect, there will be no difference. If there are differences in the corresponding samples, it means that the pre-distortion process requires updating.

The block 2016 selects a set of sample pairs (on the order of 10 to a couple of hundred) that provide samples points across the full range of amplitude in use. As one versed in the arts will recognize, the size of the sample pairs is an implementation detail and does not detract from the general application of the invention. As shown in FIG. 1-c, the example of the AM/AM and AM/PM amplifier transfer function, the AM/AM and AM/PM transfer curves tend to be monotonic and can be closely approximated by a $3^{rd}$ or $5^{th}$ order fit or a slightly higher order fit. The number of samples requird across the range of input power levels require to estimate the curve fit is small and can be one the order of tens to a few hundreds of samples. As one versed in the arts will recognize, the number of samples of the input power levels and the order of the curve fit used are an implementation details and do not detract from the general application of the invention.

In one embodiment of the invention, the AM/AM and AM/PM corrections for these samples are computed and then a $3^{rd}$ or $5^{th}$ order curve fit is done to the points and the coefficients are sent to block 2018 where the coefficients of the equations for the AM/AM and AM/PM curves are used to compute the new LUT values to be downloaded to blocks 2005 and 2006.

In one embodiment, the block 2016 will perform the AM/AM and AM/PM comparison on a compound real signal and in another it is done on the I and Q components of the signals. In one embodiment, the composite signal from 2017 is decomposed into the I and Q components and phase rotated to align the with the I and Q components of the post amplified signal from block 2015.

In block 2016, (the timing alignment of the samples has been done in block 2015), the amplitude and phase of the sampled post amplification and non-pre-distorted samples may not be perfect. The difference between the amplitude and the phase will be the information required to update the pre-distortion functions.

Figure 4:
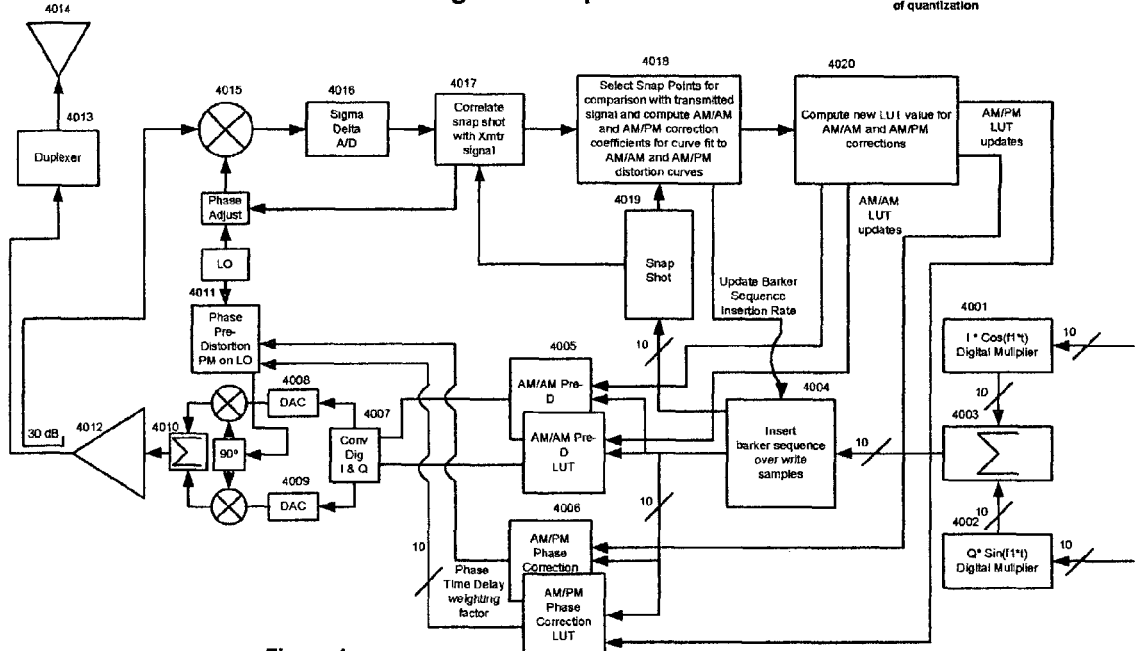
FIG. 4: Top Level Block Diagram of Non-linear Transmitter with Digital AM/AM and Analog AM/PM Pre-Distortion Compensation

In FIG. 4, another embodiment of the phase compensation is shown. In FIG. 4, the block in FIG. 2, 2007 is functionally replaced by block 4011. In FIG. 4 the AM/PM pre-distortion compensation is done via an analog method by adjusting the phase of the LO under digital control from what was 4006 in FIG. 4. The phase correction is done on the LO and the 90 degree offset quadrature LO.

In one embodiment of each of the embodiments shown in FIGS. 2 and 4, a variation is shown in FIG. 5 in which the calibration to the update of the pre-distortion function does not depend on the correlation of the pre and post amplified signals. In this embodiment, the sampled value of the post amplified signal, from 5013 is down converted and digitized and the digital samples are used to compute a series description of the non-linear channel. A series like a Voltera or a Taylor series may be used. In this example, a Voltera series is used. The digital values of the sampled post amplified signal are used to compute the coefficients of the following series: $aX+bY+cXY+dX^2Y+eY^2X+fX^3+gY^3$ . . . X and Y are successive samples and the coefficients a, b, c, d, e, f and g are computed by solving simultaneous equations based on some number of samples. With the coefficients and the nonlinear series, the residual nonlinearities can be computed and then used to update the AM/AM and AM/PM pre-distortion functions.

In different embodiments, subsets of the series may be used, such as maybe the odd order terms. The number of terms used will depend on the application and the characteristics of the non-linear amplifier chain. The number of X and Y samples used will depend on the application.

In another embodiment of this invention, more than two successive values may be used to compute the non-linear characteristics. An example of this is $aXYZ+bX^2Y+cXY^2+dX^2Z+eXZ^2+fY^2Z+gXZ^2+hYZ^2+iX^3+jY^3+kZ^3$ . . . wherein the $3^{rd}$ order terms are used. In different embodiments of this invention, different terms are used based on the type of non-linearity. In a number of nonlinear channels, the $3^{rd}$ order terms are the most important. This example is not intended to be limiting as the type of series to be used or the number or the order the terms. These will be applications specific.

FIG. 5 shows the digital control of the phase pre-distortion function, but the analog version of the phase correction shown in FIG. 4 is also applicable here.

What is claimed is:

1. A method comprising:
   a pre-distortion of a signal which will be subjected to a non-linear channel wherein the signal will be distorted by the non-linear characteristic of the channel and the pre-distortion will induce the opposite distortion to that of the channel;
   a method wherein the signal will be converted from a complex I and Q baseband signal to a digital IF composite real signal and the AM/AM and AM/PM pre-distortion is performed on the real composite signal;
   a method wherein the pre-distorted signal is converted back to a complex I and Q form and the I and Q channels are individually converted to a baseband analog form and then the compound real signal is created at RF after the complex up conversion to RF;
   a method wherein the post amplified signal is sampled and is compared to the non-pre-distorted compound real signal to determine the error in the AM/AM and AM/PM pre-distortion algorithm;
   a method wherein the non-linear pre-distortion algorithm is updated with the data from the comparison of the pre-distorted post amplified signal and the non-pre-distorted signals;
   a method wherein the AM/AM and AM/PM pre-distortion LUTs are dual memories wherein one is updated while the other is used and then they are switched in one symbol time so no data is lost in the algorithm update process;
   a method where in the AM/PM pre distortion is done digitally;
   a method where in the AM/PM pre-distortion is done via an analog technique;
   a method wherein the non-linear pre-distortion algorithm is computed by computing a series model of the non-linear channel by computing a series from the sampled values of the post amplified pre-distorted signal.

2. The method defined in claim 1, wherein the I digital channel signal is multiplied by a digital cosine signal and converted to a digital IF.

3. The method defined in claim 1, wherein the Q digital channel signal is multiplied by a digital sine signal and converted to a digital IF.

4. The method defined in claim 1, wherein the digital IF I channel is added to the digital IF Q channel to create a digital IF real compound signal.

5. The method defined in claim 1, wherein the digital IF real compound signal is over written on a small number of uniformly or non-uniformly spaced samples with a Barker type of sequence with high autocorrelation properties to facilitate the time offset calibration between the post amplified pre-distorted signal and the non-pre-distorted signal.

6. The method defined in claim 1, wherein the over writing of samples with a Barker type of sequence is reduced or eliminated after the time offset correlation has been established and then the offset is the updated via correlation of just signal sample values.

7. The method defined in claim 1, wherein copies of the samples of the signal to be pre-distorted are sent to two sets of LUTs, one for the AM/AM and one for the AM/PM.

8. The method defined in claim 1, wherein the stored values in the AM/AM pre-distortion table are addressed by the non-pre-distorted samples and the values stored in the AM/AM table are the values of the pre-distorted signal compensating for the anticipated AM/AM in the amplification chain.

9. The method defined in claim 1, wherein the values stored in the AM/AM predistortion table are limited such that no value output from the memory will allow signal clipping in the amplifier chain, minimizing sidelobe regrowth and out of band emissions.

10. The method defined in claim 1, wherein the output values of the AM/AM pre-distortion LUT are digitally phase shifted to induce the opposite AM/PM distortion such that the output of the amplifier is near distortion free.

11. A method defined in claim 1, wherein the pre-distorted compound real signal at a low IF is de-composed into I and Q baseband or digital zero IF by a digital complex down conversion prior to the conversion to analog baseband I and Q for complex up conversion to RF.

12. A method defined in claim 1, wherein the pre-distorted analog I and Q signals are used to create a compound real signal at RF for final amplification via a pre-amplifier and/or the HPA.

13. A Method defined in claim 1, wherein the output of the HPA is sampled via an RF coupler and the sampled value is down converted in frequency and sampled with a A/D converter to create a sample set to be compared to the ideal non-pre-distorted signal for determination of the error in the pre-distortion function to support the update of the pre-distortion function.

14. A method defined in claim 1, wherein the non-pre-distorted signal is sampled and a snap shot taken which is then correlated in time with the RF sampled value and the timing offset is determined.

15. A Method defined in claim 1, wherein the non-pre-distorted signal values of a given set of samples is compared to the post amplified pre-distorted signal to determine the error is the AM/AM and AM/PM correction.

16. A method defined in claim 1, wherein the errors in the AM/AM and AM/PM are used to generate $3^{rd}$ or $5^{th}$ or $7^{th}$ or higher order curve fits to predict the time and temperature dependent AM/AM and AM/PM correction.

17. A method defined in claim 1, wherein the calculated curves for the AM/AM and AM/PM are used to compute the new updated values for the AM/AM and AM/PM LUTs and the standby LUTs are updated and switched in, within one sample time, to prevent loss of date during the update process, providing for continual calibration of the pre-distortion process over time and temperature.

18. A method defined in claim 1, wherein the size of the LUTs is kept to a minimum because the size of LUT is limited by the addressed registers which is equal to the number of bits in the composite real signal at the digital IF.

19. A method defined in claim 1, wherein the pre-distortion algorithm is updated by generating a series representation of the residual nonlinear channel distortions with a Voltera or Taylor series of like mathematical expression generated from the sampled post amplified signal.

20. A method defined in claim 1, wherein the I and Q signals are use to create a composite real signal as a digital IF where the pre-distortion is preformed and the composite signal is decomposed back to I and Q after pre-distortion and then converted to analog signals and converted to the composite real signal at RF via a complex up conversion.

21. An apparatus comprising:
   a pre-distortion of a signal which will be subjected to a non-linear channel wherein the signal will be distorted by the non-linear characteristic of the channel and the pre-distortion will induce the opposite distortion to that of the channel;
   a method wherein the signal will be converted from a complex I and Q baseband signal to a digital IF composite real signal and the AM/AM and AM/PM pre-distortion is performed on the real composite signal;
   a method wherein the pre-distorted signal is converted back to a complex I and Q form and the I and Q channels are individually converted to a baseband analog form and then the compound real signal is created at RF after the complex up conversion to RF;
   a method wherein the post amplified signal is sampled and is compared to the non-pre-distorted compound real signal to determine the error in the AM/AM and AM/PM pre-distortion algorithm;
   a method wherein the non-linear pre-distortion algorithm is updated with the data from the comparison of the pre-distorted post amplified signal and the non-pre-distorted signals;
   a method wherein the AM/AM and AM/PM pre-distortion LUTs are dual memories wherein one is updated while the other is used and then they are switched in one symbol time so no data is lost in the algorithm update process;
   a method where in the AM/PM pre distortion is done digitally;
   a method where in the AM/PM pre-distortion is done via an analog technique;
   a method wherein the non-linear pre-distortion algorithm is computed by computing a series model of the non-linear channel by computing a series from the sampled values of the post amplified pre-distorted signal.

22. The apparatus defined in claim 21, wherein the I digital channel signal is multiplied by a digital cosine signal and converted to a digital IF.

23. The apparatus defined in claim 21, wherein the Q digital channel signal is multiplied by a digital sine signal and converted to a digital IF.

24. The apparatus defined in claim 21, wherein the digital IF I channel is added to the digital IF Q channel to create a digital IF real compound signal.

25. The apparatus defined in claim 21, wherein the digital IF real compound signal is over written on a small number of uniformly spaced samples with a Barker type of sequence with high autocorrelation properties to facilitate the time offset calibration between the post amplified pre-distorted signal and the non-pre-distorted signal.

26. The apparatus defined in claim 21, wherein the over writing of samples with a Barker type of sequence is reduced or eliminated after the time offset correlation has been established and then the offset is the updated via correlation of just signal sample values.

27. The apparatus defined in claim 21, wherein copies of the samples of the signal to be pre-distorted at sent to two sets of LUTs, one for the AM/AM and one for the AM/PM.

28. The apparatus defined in claim 21, wherein the stored values in the AM/AM pre-distortion table are addressed by the non-pre-distorted samples and the values stored in the AM/AM table are the values of the pre-distorted signal compensating for the anticipated AM/AM in the amplification chain.

29. The apparatus defined in claim 21, wherein the values stored in the AM/AM predistortion table are limited such that no value output from the memory will allow signal clipping in the amplifier chain, minimizing sidelobe regrowth and out of band emissions.

30. The apparatus defined in claim 21, wherein the output values of the AM/AM pre-distortion LUT are digitally phase shifted to induce the opposite AM/PM distortion such that the output of the amplifier is near distortion free.

31. The apparatus defined in claim 21, wherein the pre-distorted compound real signal at a low IF is decomposed into I and Q baseband or digital zero IF by a digital complex down conversion prior to the conversion to analog baseband I and Q for complex up conversion to RF.

32. The apparatus defined in claim 21, wherein the pre-distorted analog I and Q signals are used to create a compound real signal at RF for final amplification via a pre-amplifier and the HPA.

33. The apparatus defined in claim 21, wherein the output of the HPA is sampled via an RF coupler and the sampled value is down converted in frequency and sampled with a A/D converter to create a sample set to be compared to the ideal non-pre-distorted signal for determination of the error in the pre-distortion function to support the update of the pre-distortion function.

34. The apparatus defined in claim 21, wherein the non-pre-distorted signal is sampled and a snap shot taken which is then correlated in time with the RF sampled value and the timing offset is determined.

35. The apparatus defined in claim 21, wherein the non-pre-distorted signal values of a given set of samples is compared to the post amplified pre-distorted signal to determine the error is the AM/AM and AM/PM correction.

36. The apparatus defined in claim 21, wherein the errors in the AM/AM and AM/PM are used to generate $3^{rd}$ or $5^{th}$ or $7^{th}$ or higher order curve fits to predict the time and temperature dependent AM/AM and AM/PM correction.

37. The apparatus defined in claim 21, wherein the calculated curves for the AM/AM and AM/PM are used to compute the new updated values for the AM/AM and AM/PM LUTs and the standby LUTs are updated and switched in, within one sample time, to prevent loss of date during the update process, providing for continual calibration of the pre-distortion process over time and temperature.

38. The apparatus defined in claim 21, wherein the size of the LUTs is kept to a minimum because the size of LUT is limited by the addressed registers which is equal to the number of bits in the composite real signal at the digital IF.

39. The apparatus defined in claim 21, wherein the pre-distortion algorithm is updated by generating a series representation of the residual nonlinear channel distortions with a Voltera or Taylor series of like mathematical expression generated from the sampled post amplified signal.

40. The apparatus defined in claim 21, wherein the I and Q signals are use to create a composite real signal as a digital IF where the pre-distortion is preformed and the composite signal is decomposed back to I and Q after pre-distortion and then converted to analog signals and converted to the composite real signal at RF via a complex Upconversion.

* * * * *